(12) United States Patent
Teranishi

(10) Patent No.: US 12,354,995 B2
(45) Date of Patent: Jul. 8, 2025

(54) LAMINATED DEVICE CHIP MANUFACTURING METHOD

(71) Applicant: DISCO CORPORATION, Tokyo (JP)

(72) Inventor: Shunsuke Teranishi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 533 days.

(21) Appl. No.: 17/656,737

(22) Filed: Mar. 28, 2022

(65) Prior Publication Data

US 2022/0336409 A1 Oct. 20, 2022

(30) Foreign Application Priority Data

Apr. 16, 2021 (JP) ................... 2021-069658

(51) Int. Cl.
*H01L 23/00* (2006.01)
*H01L 21/56* (2006.01)

(52) U.S. Cl.
CPC ............ *H01L 24/94* (2013.01); *H01L 21/561* (2013.01)

(58) Field of Classification Search
CPC .............................. H01L 24/94; H01L 21/561
USPC ........................................................ 438/109
See application file for complete search history.

(56) References Cited

U.S. PATENT DOCUMENTS

| 8,426,948 B2 * | 4/2013 | Sasaki | H01L 24/05 257/723 |
| 2012/0025355 A1 | 2/2012 | Sasaki et al. | |
| 2020/0051847 A1 * | 2/2020 | Kiuchi | B23K 26/38 |
| 2020/0230936 A1 * | 7/2020 | Suzuki | H01L 21/6835 |
| 2022/0028723 A1 * | 1/2022 | Sakurai | H01L 21/561 |

FOREIGN PATENT DOCUMENTS

| JP | 2003234451 A | 8/2003 | |
| JP | 2008153499 A | 7/2008 | |
| JP | 2012033860 A | 2/2012 | |
| JP | 2012195388 A | 10/2012 | |
| JP | 2014116561 A | 6/2014 | |
| JP | 2015119109 | * 6/2015 | ... H01L 2224/16145 |
| JP | 2015119109 A | 6/2015 | |
| JP | 2020194936 A | 12/2020 | |

OTHER PUBLICATIONS

Japanese Patent Application [JP 2021-069658 A]: English translation of Notice of Reasons for Refusal, Dec. 10, 2024 (3 pages).

* cited by examiner

*Primary Examiner* — Ori Nadav
(74) *Attorney, Agent, or Firm* — Greer, Burns & Crain, Ltd

(57) ABSTRACT

A laminated device chip manufacturing method includes: a first wafer processing step of exposing a first resin layer disposed in first grooves to an undersurface side of a first wafer by thinning the first wafer fixed to a first support; a laminating step of laminating the undersurface side of the first wafer and a top surface side of a second wafer to each other such that the first resin layer exposed to the undersurface side of the first wafer and a second resin layer disposed in second grooves of the second wafer coincide with each other; a second wafer processing step of exposing the second resin layer disposed in the second grooves to an undersurface side of the second wafer by thinning the second wafer; and a resin layer cutting step of manufacturing laminated device chips by cutting the first resin layer and the second resin layer.

6 Claims, 12 Drawing Sheets

LAMINATED DEVICE CHIP MANUFACTURING METHOD

BACKGROUND OF THE INVENTION

Field of the Invention

The present invention relates to a method of manufacturing laminated device chips having a structure in which a plurality of device chips are stacked.

Description of the Related Art

In electronic apparatuses typified by mobile telephones and personal computers, a device chip including a device such as an electronic circuit is an essential constituent element. The device chip is, for example, obtained by demarcating the top surface of a wafer formed of a semiconductor material such as silicon into a plurality of regions by planned dividing lines (streets), forming a device in each of the regions, and thereafter dividing the wafer by the planned dividing lines.

In recent years, technology referred to as a wafer on wafer technology in which a plurality of wafers each formed with devices are stacked in a thickness direction and bonded together has been put to practical use in order to realize further miniaturization and higher density of device chips (see Japanese Patent Laid-Open No. 2008-153499, for example). After a laminated wafer is formed by stacking the plurality of wafers on top of another, laminated device chips having a structure in which a plurality of device chips are stacked are obtained by dividing the laminated wafer along the planned dividing lines.

When the wafers used for the wafer on wafer technology are thinned, the wafers tend to be damaged at a time of dividing the laminated wafer into the laminated device chips by cutting the laminated wafer. Accordingly, considered for adoption is a method that thins a wafer while dividing the wafer into a plurality of device chips by forming grooves at the planned dividing lines of the wafer from a top surface side, affixing the top surface of the wafer to a support, and then grinding the wafer and thereby exposing the grooves on an undersurface side (see Japanese Patent Laid-Open No. 2015-119109, for example).

SUMMARY OF THE INVENTION

After the device chips in a state of being supported by the support are obtained by the above-described method, laminated device chips can be formed by, for example, stacking other device chips obtained by a similar method on the device chips. However, when the laminated device chips are formed by stacking the device chips in a thickness direction by this method, a gap is formed between two adjacent laminated device chips.

Therefore, when a film constituted by an insulator, an electrode constituted by a metal, or the like is to be further formed for the laminated device chips obtained by this method, for example, foreign matter constituted by the insulator or the metal adheres also to the side surfaces of the laminated device chips, which face the gap. Therefore, in a case of adopting the above-described method, a process of thereafter removing the foreign matter adhering to the laminated device chips is necessary.

It is accordingly an object of the present invention to provide a novel laminated device chip manufacturing method that can suppress adhesion of foreign matter to the side surfaces of laminated device chips.

In accordance with an aspect of the present invention, there is provided a laminated device chip manufacturing method for manufacturing laminated device chips having a structure in which a plurality of device chips are stacked, by using wafers having a device disposed in each of a plurality of regions of a top surface demarcated by a plurality of planned dividing lines. The laminated device chip manufacturing method includes: a first groove forming step of forming first grooves of a depth corresponding to a finished thickness of first device chips obtained by dividing a first wafer from a top surface of the first wafer along a plurality of planned dividing lines of the first wafer; a first resin layer forming step of forming a first resin layer in the first grooves of the first wafer; a second groove forming step of forming second grooves of a depth corresponding to a finished thickness of second device chips obtained by dividing a second wafer from a top surface of the second wafer along a plurality of planned dividing lines of the second wafer; a second resin layer forming step of forming a second resin layer in the second grooves of the second wafer; a fixing step of fixing a top surface side of the first wafer to a plate-shaped first support; a first wafer processing step of exposing the first resin layer disposed in the first grooves to an undersurface side of the first wafer by thinning the first wafer fixed to the first support to a thickness corresponding to the finished thickness of the first device chips from the undersurface side; a laminating step of laminating the undersurface side of the first wafer and a top surface side of the second wafer to each other such that the first resin layer exposed to the undersurface side of the first wafer and the second resin layer disposed in the second grooves of the second wafer coincide with each other as viewed from a direction perpendicular to an undersurface of the first wafer; a second wafer processing step of exposing the second resin layer disposed in the second grooves to an undersurface side of the second wafer by thinning the second wafer laminated to the first wafer to a thickness corresponding to the finished thickness of the second device chips from the undersurface side; and a resin layer cutting step of manufacturing the laminated device chips having a structure in which the first device chips having side surfaces covered by the first resin layer and the second device chips having side surfaces covered by the second resin layer are stacked, by cutting the first resin layer along the first grooves, and cutting the second resin layer along the second grooves.

In accordance with another aspect of the present invention, there is provided a laminated device chip manufacturing method for manufacturing laminated device chips having a structure in which a plurality of device chips are stacked, by using wafers having a device disposed in each of a plurality of regions of a top surface demarcated by a plurality of planned dividing lines. The laminated device chip manufacturing method includes: a first groove forming step of forming first grooves of a depth corresponding to a finished thickness of first device chips obtained by dividing a first wafer from a top surface of the first wafer along a plurality of planned dividing lines of the first wafer; a first resin layer forming step of forming a first resin layer in the first grooves of the first wafer; a first fixing step of fixing a top surface side of the first wafer to a plate-shaped first support; a first wafer processing step of exposing the first resin layer disposed in the first grooves to an undersurface side of the first wafer by thinning the first wafer fixed to the first support to a thickness corresponding to the finished thickness of the first device chips from the undersurface side; a second groove forming step of forming second grooves of a depth corresponding to a finished thickness of second device chips obtained by dividing a second wafer from a top surface of the second wafer along a plurality of planned dividing lines of the second wafer; a second resin layer forming step of forming a second resin layer in the second grooves of the second wafer; a second fixing step of fixing a top surface side of the second wafer to a plate-shaped second support; a second wafer processing step of exposing the second resin layer disposed in the second grooves to an undersurface side of the second wafer by thinning the second wafer fixed to the second support to a thickness corresponding to the finished thickness of the second device chips from the undersurface side; a laminating step of separating the second support from the second wafer, and then laminating the undersurface side of the first wafer and the top surface side of the second wafer to each other such that the first resin layer exposed to the undersurface side of the first wafer and the second resin layer exposed to the top surface side of the second wafer coincide with each other as viewed from a direction perpendicular to an undersurface of the first wafer; and a resin layer cutting step of manufacturing the laminated device chips having a structure in which the first device chips having side surfaces covered by the first resin layer and the second device chips having side surfaces covered by the second resin layer are stacked, by cutting the first resin layer along the first grooves, and cutting the second resin layer along the second grooves.

In accordance with a further aspect of the present invention, there is provided a laminated device chip manufacturing method for manufacturing laminated device chips having a structure in which a plurality of device chips are stacked, by using wafers having a device disposed in each of a plurality of regions of a top surface demarcated by a plurality of planned dividing lines. The laminated device chip manufacturing method includes: a first groove forming step of forming first grooves of a depth corresponding to a finished thickness of first device chips obtained by dividing a first wafer from a top surface of the first wafer along a plurality of planned dividing lines of the first wafer; a first resin layer forming step of forming a first resin layer in the first grooves of the first wafer; a first fixing step of fixing a top surface side of the first wafer to a plate-shaped first support; a first wafer processing step of exposing the first resin layer disposed in the first grooves to an undersurface side of the first wafer by thinning the first wafer fixed to the first support to a thickness corresponding to the finished thickness of the first device chips from the undersurface side; a second groove forming step of forming second grooves of a depth corresponding to a finished thickness of second device chips obtained by dividing a second wafer from a top surface of the second wafer along a plurality of planned dividing lines of the second wafer; a second resin layer forming step of forming a second resin layer in the second grooves of the second wafer; a second fixing step of fixing a top surface side of the second wafer to a plate-shaped second support; a second wafer processing step of exposing the second resin layer disposed in the second grooves to an undersurface side of the second wafer by thinning the second wafer fixed to the second support to a thickness corresponding to the finished thickness of the second device chips from the undersurface side; a laminating step of laminating the undersurface side of the first wafer and the undersurface side of the second wafer to each other such that the first resin layer exposed to the undersurface side of the first wafer and the second resin layer exposed to the undersurface side of the second wafer coincide with each other as viewed from a direction perpendicular to an undersurface of the first wafer; and a resin layer cutting step of separating the second support from the second wafer, and then manufacturing the laminated device chips having a structure in which the first device chips having side surfaces covered by the first resin layer and the second device chips having side surfaces covered by the second resin layer are stacked, by cutting the first resin layer along the first grooves, and cutting the second resin layer along the second grooves.

Preferably, the laminated device chip manufacturing method further includes a through electrode forming step of forming through electrodes that connect devices of the first wafer to devices of the second wafer laminated to the first wafer. In addition, preferably, the resin layer cutting step separates the first support from the first wafer, and then cuts the first resin layer along the first grooves and cuts the second resin layer along the second grooves.

The laminated device chip manufacturing method according to each aspect of the present invention forms the first grooves of the depth corresponding to the finished thickness of the first device chips in the first wafer and then forms the first resin layer in the first grooves, and forms the second grooves of the depth corresponding to the finished thickness of the second device chips in the second wafer and then forms the second resin layer in the second grooves.

Therefore, the side surfaces of the first device chips obtained from the first wafer and the side surfaces of the second device chips obtained from the second wafer are covered by the first resin layer and the second resin layer, respectively. That is, the side surfaces of the laminated device chips having a structure in which the first device chips and the second device chips are stacked are also covered by the first resin layer and the second resin layer. It is thereby possible to suppress the adhesion of foreign matter to the side surfaces of the laminated device chips.

In addition, when the first wafer is thinned to the finished thickness of the first device chips, and the second wafer is thinned to the finished thickness of the second device chips, the first wafer is divided into the first device chips, and the second wafer is divided into the second device chips. Therefore, the laminated device chips can be completed by merely cutting the first resin layer along the first grooves, and cutting the second resin layer along the second grooves. That is, the first wafer and the second wafer are not damaged when cut into the laminated device chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
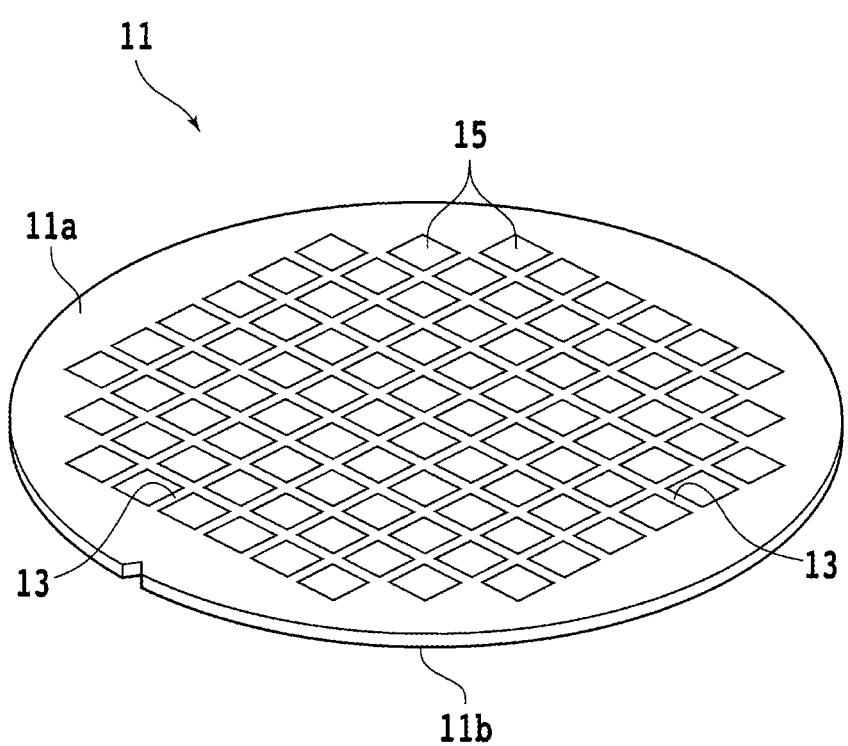
FIG. 1 is a perspective view schematically depicting a first wafer.
Figure 2:
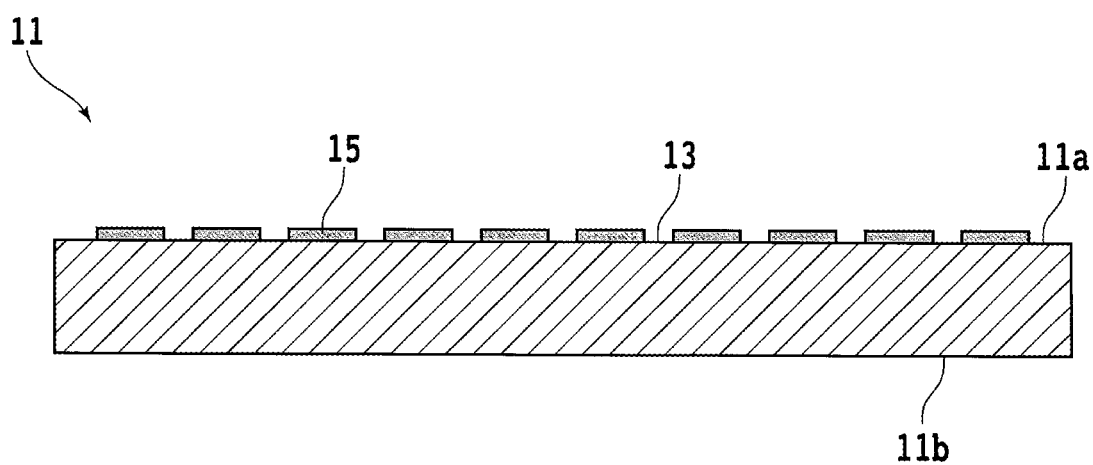
FIG. 2 is a sectional view schematically depicting the first wafer.

An embodiment of the present invention will hereinafter be described with reference to the accompanying drawings. FIG. 1 is a perspective view schematically depicting a first wafer 11 used in a laminated device chip manufacturing method according to the present embodiment. FIG. 2 is a sectional view schematically depicting the first wafer 11. Incidentally, while FIG. 1 and FIG. 2 illustrate only the first wafer 11 of a plurality of wafers used in the present embodiment, a second wafer 31 (see FIG. 8) used in the present embodiment also has a similar structure.

As depicted in FIG. 1 and FIG. 2, the first wafer 11 is, for example, formed in a disk shape by using a semiconductor such as silicon (Si), and has a substantially circular top surface 11a and a substantially circular undersurface 11b. The top surface 11a side of the first wafer 11 is demarcated into a plurality of small regions by a plurality of planned dividing lines (streets) 13 intersecting one another. A device 15 such as an integrated circuit (IC) is provided in each of the small regions.

It is to be noted that while the present embodiment uses the disk-shaped first wafer 11 formed of a semiconductor such as silicon, a material, a shape, a structure, a size, and the like of the first wafer 11 are not limited. For example, a substrate formed of a material such as another semiconductor, a ceramic, a resin, or a metal can also be used as the first wafer 11. Similarly, a kind, a quantity, a shape, a structure, a size, an arrangement, and the like of the devices 15 are not limited either.

Figure 3:
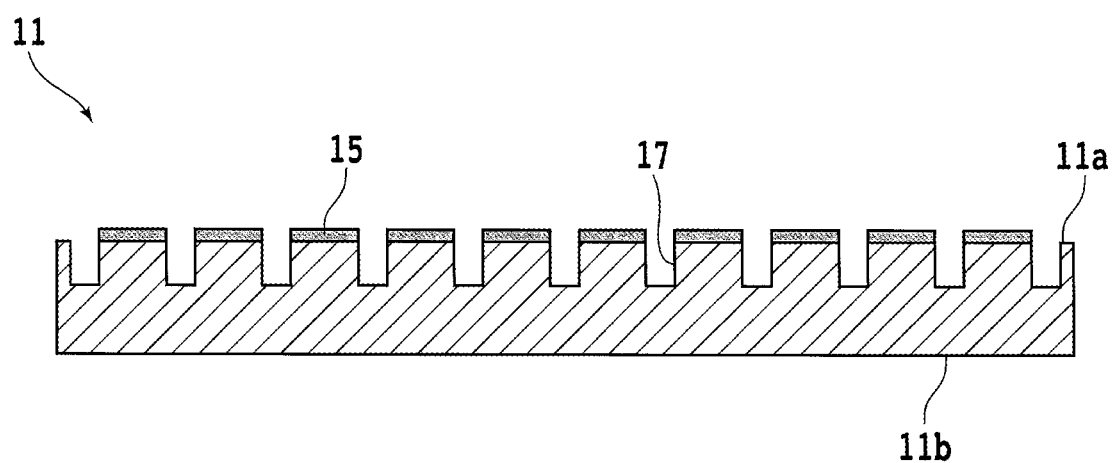
FIG. 3 is a sectional view schematically depicting the first wafer in which first grooves are formed.

In the laminated device chip manufacturing method according to the present embodiment, for example, first grooves of a depth corresponding to a finished thickness of first device chips obtained by dividing the first wafer 11 are formed from the top surface 11a of the first wafer 11 along the plurality of planned dividing lines 13 of the first wafer 11 (first groove forming step). FIG. 3 is a sectional view schematically depicting the first wafer 11 in which the first grooves 17 are formed.

When the first grooves 17 are formed, an annular (disk-shaped) cutting blade (cutting tool), for example, is used, which is obtained by fixing abrasive grains of diamond or the like with a binder such as a resin. Specifically, the cutting blade and the first wafer 11 are moved relative to each other along the planned dividing lines 13 while the cutting blade is rotated around a substantially horizontal rotational axis (axial rotation), and is made to cut into the first wafer 11. Incidentally, a processing liquid such as pure water is supplied to a processing point at which the first wafer 11 and the cutting blade are in contact with each other.

The present embodiment makes the cutting blade cut into the first wafer 11 to a depth slightly exceeding the finished thickness of the first device chips obtained by dividing the first wafer 11. It is thus possible to form the first grooves 17 of the depth slightly exceeding the finished thickness of the first device chips by cutting the first wafer 11 from the top surface 11a.

However, there is no particular limitation on the method of forming the first grooves 17. For example, the first grooves 17 can be formed in the first wafer 11 by a method referred to as so-called ablation processing, which uses a laser beam of a wavelength absorbed by the first wafer 11. In addition, the first grooves 17 may be formed in the first wafer 11 by etching using a gas (including plasma) or a liquid having a high responsiveness to the first wafer 11. Further, it is also possible to form the first grooves 17 in the first wafer 11 by an optional combination of these methods.

Figure 4:
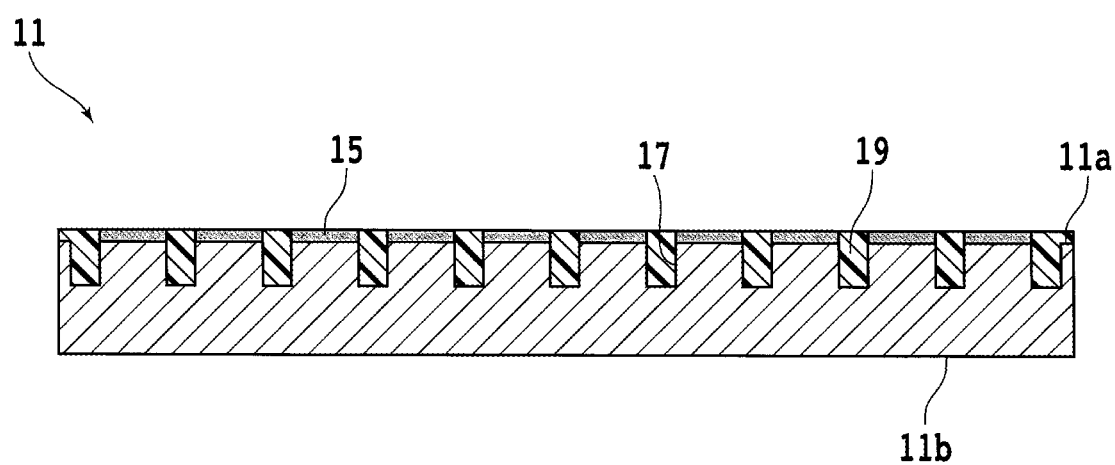
FIG. 4 is a sectional view schematically depicting the first wafer provided with a first resin layer in the first grooves.

After the first grooves 17 are formed at all of the planned dividing lines 13, a first resin layer is formed by filling the first grooves 17 with a material in a liquid state (first resin layer forming step). FIG. 4 is a sectional view schematically depicting the first wafer 11 provided with a first resin layer 19 in the first grooves 17. A method such as spin coating, spray coating, screen printing, dip coating, or ink jetting is used when the first grooves 17 are filled with the material in a liquid state. Of course, the first grooves 17 may be filled with the material in a liquid state by another method.

It is preferable to use, as the material in a liquid state which is filled into the first grooves 17, a material having both a high heat resistance to a certain degree and a thermal expansion coefficient (typically a linear expansion coefficient) close to that of the first wafer 11. For example, in a case where the first wafer 11 is formed by using silicon, it is preferable to use benzocyclobutene (BCB) used to laminate wafers to each other by the wafer on wafer technology, a material for a mold resin used in a fan out package, or the like.

However, the material in a liquid state, which is filled into the first grooves 17, is not limited to these materials. After the first grooves 17 are filled with the material in a liquid state, the material in a liquid state is cured by a method such as heating, drying, or irradiation with light. The first resin layer 19 that covers the side surfaces and bottom surfaces of the first grooves 17 of the first wafer 11 is thereby formed in the first grooves 17.

The present embodiment forms second grooves (see FIG. 8) and a second resin layer 39 (see FIG. 8) in the second wafer 31 different from the first wafer 11 by a method similar to the above-described method. Specifically, the second grooves 37 of a depth corresponding to a finished thickness of second device chips obtained by dividing the second wafer 31 are formed from a top surface 31a (see FIG. 8) of the second wafer 31 along the plurality of planned dividing lines (streets) of the second wafer 31 (second groove forming step).

The present embodiment forms the second grooves 37 of the depth slightly exceeding the finished thickness of the second device chips by cutting the second wafer 31 from the top surface 31a. In addition, the second resin layer 39 is formed by filling the second grooves 37 with a material in a liquid state (second resin layer forming step). The material in a liquid state, which is filled into the second grooves 37, is similar to the material in a liquid state, which is filled into the first grooves 17. That is, it is preferable to use a material having both a high heat resistance to a certain degree and a thermal expansion coefficient (typically a linear expansion coefficient) close to that of the second wafer 31.

Incidentally, the formation of the first grooves 17 (first groove forming step), the formation of the first resin layer 19 (first resin layer forming step), the formation of the second grooves 37 (second groove forming step), and the formation of the second resin layer 39 (second resin layer forming step) can be performed in optional timing and order in which no contradiction occurs in the series of processes according to the present embodiment.

For example, it is possible to form the first grooves 17 and the first resin layer 19 in the first wafer 11 after forming the second grooves 37 and the second resin layer 39 in the second wafer 31. In addition, the formation of the first grooves 17 and the first resin layer 19 and the formation of the second grooves 37 and the second resin layer 39 may be performed in parallel with each other.

Figure 5:
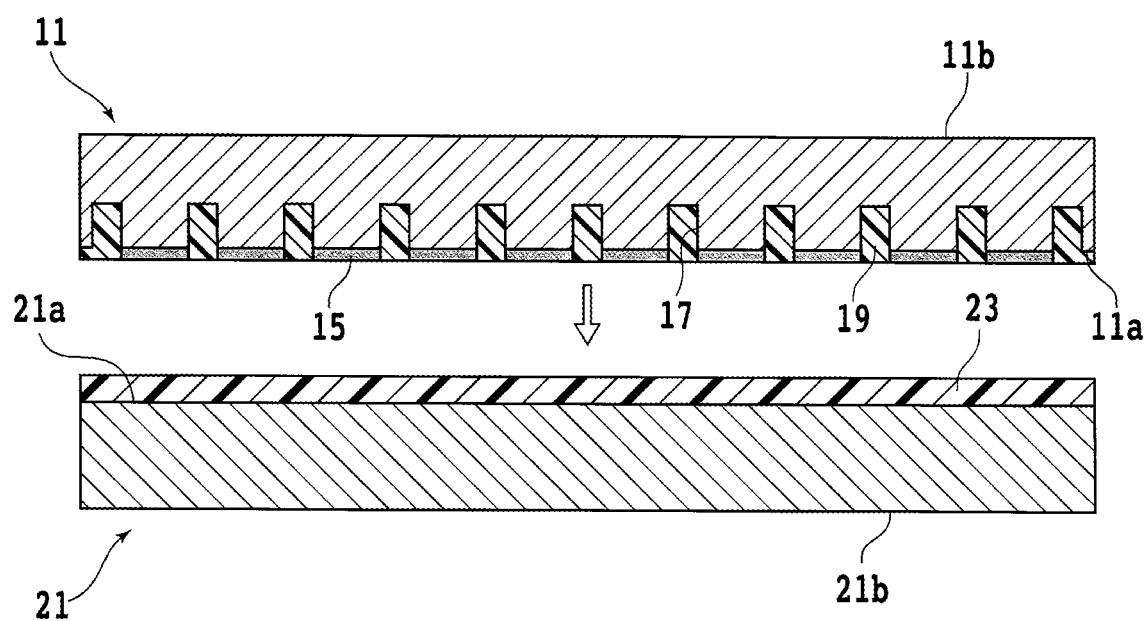
FIG. 5 is a sectional view depicting a state in which the first wafer is being fixed to a plate-shaped first support.
Figure 6:
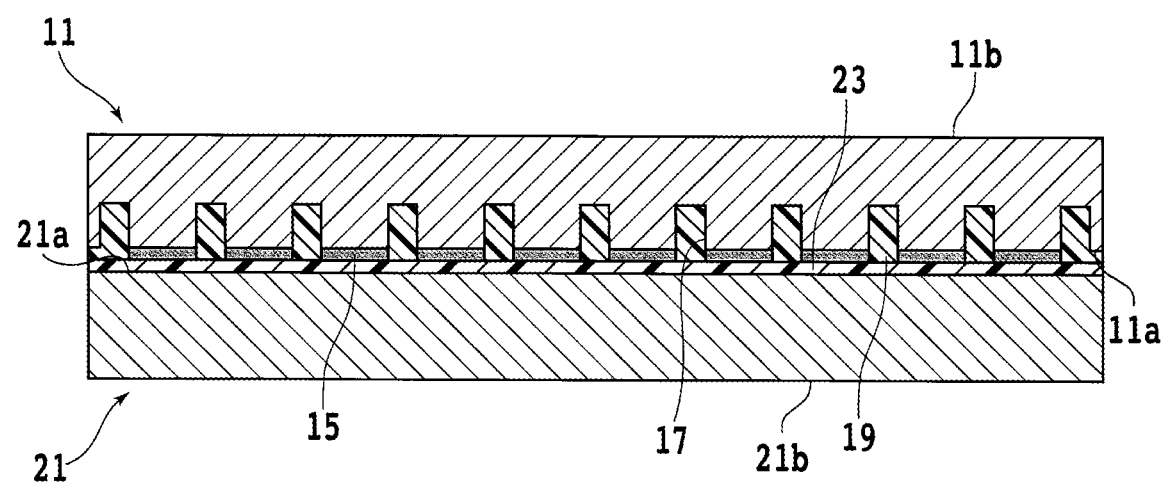
FIG. 6 is a sectional view schematically depicting the first support and the first wafer fixed to the first support.

After the first grooves 17 and the first resin layer 19 are formed in the first wafer 11, the top surface 11a side of the first wafer 11 is fixed to a plate-shaped first support (fixing step). FIG. 5 is a sectional view depicting a state in which the first wafer 11 is being fixed to the plate-shaped first support 21. FIG. 6 is a sectional view schematically depicting the first support 21 and the first wafer 11 fixed to the first support 21.

The first support 21 is typically a substrate formed of a resin, a substrate formed of a glass, a wafer of the same kind as or a different kind from the first wafer 11, or the like. The first support 21 is formed in a size capable of supporting the first wafer 11. Specifically, the first support 21 has a top surface 21a and an undersurface 21b that are of a size equal to or more than that of the top surface 11a of the first wafer 11.

When the top surface 11a side of the first wafer 11 is fixed to the first support 21, an adhesive layer (provisional adhesive layer) 23 including an adhesive exhibiting an adhesive force is provided to the top surface 21a of the first support 21, as depicted in FIG. 5, for example. Used as the adhesive layer 23 is, for example, a material in a liquid state whose adhesive force is decreased by light such as ultraviolet rays or heat so that completed laminated device chips can be properly separated from the first support 21.

However, the adhesive layer 23 used to fix the first wafer 11 is not limited to this. For example, a material whose adhesive force is not decreased easily over a long period of time may be used as the adhesive layer 23 in a case where completed products (chips) including the first support 21 and the laminated device chips are manufactured by cutting the first support 21 together with the laminated device chips.

As depicted in FIG. 6, the first wafer 11 is fixed to the first support 21 by bringing the top surface 11a side of the first wafer 11 into close contact with the adhesive layer 23 provided to the top surface 21a of the first support 21. Thereafter, the adhesive layer 23 is preferably cured by a method such as heating, drying, or irradiation with light. Incidentally, this adhesive layer 23 may be provided to the first wafer 11 side rather than to the first support 21 side.

Figure 7:
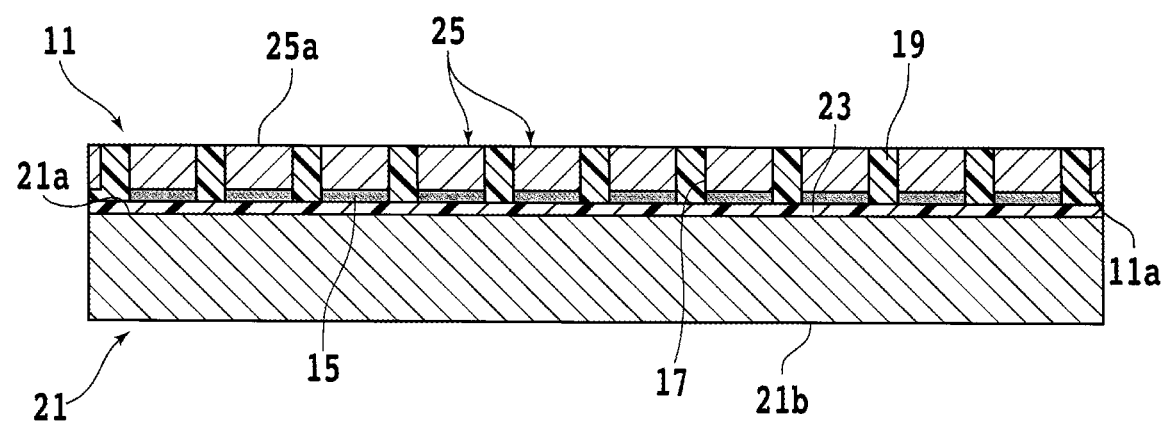
FIG. 7 is a sectional view schematically depicting the first support and the first wafer in a thinned state.

After the first wafer 11 is fixed to the first support 21, the first resin layer 19 provided to the first grooves 17 is exposed to the undersurface side of the first wafer 11 by thinning the first wafer 11 from the undersurface 11b side to a thickness corresponding to the finished thickness of the first device chips (first wafer processing step). FIG. 7 is a sectional view schematically depicting the first support 21 and the thinned first wafer 11.

When the first wafer 11 is thinned, an annular (disk-shaped) grinding wheel (grinding tool), for example, is used which is provided on a lower surface side thereof with a grindstone for grinding, the grindstone being obtained by fixing abrasive grains of diamond or the like with a binder such as a resin. Specifically, while the grinding wheel and the first wafer 11 (first support 21) are each rotated around a substantially vertical rotational axis (axial rotation), the grinding wheel is lowered, and the grindstone is pressed against the undersurface 11b of the first wafer 11. Incidentally, a processing liquid such as pure water is supplied to a processing point at which the first wafer 11 and the grindstone are in contact with each other.

The present embodiment lowers the lower surface of the grindstone to the position of a height corresponding to a finished thickness of first device chips 25 obtained by dividing the first wafer 11 (position of a height corresponding to undersurfaces 25a of the first device chips 25). The first wafer 11 can be thereby thinned to a thickness corresponding to the finished thickness of the first device chips 25 by grinding the first wafer 11 from the undersurface 11b side.

As a result, as depicted in FIG. 7, bottom portions of the first grooves 17 are removed, and the first resin layer 19 provided to the first grooves 17 is exposed to the undersurface side of the first wafer 11 (undersurface 25a side of the first device chips 25). That is, the first wafer 11 is divided into a plurality of first device chips 25 along the first grooves 17 formed at the planned dividing lines 13.

It is to be noted that there is no particular limitation on the method of thinning the first wafer 11. For example, the first wafer 11 can also be thinned by polishing using a polishing pad (polishing tool) formed of a resin typified by foamed polyurethane, a nonwoven fabric, or the like. The first wafer 11 may be thinned by etching using a gas (including plasma) or a liquid having a high responsiveness to the first wafer 11. Further, the first wafer 11 may be thinned by an optional combination of these methods.

Figure 8:
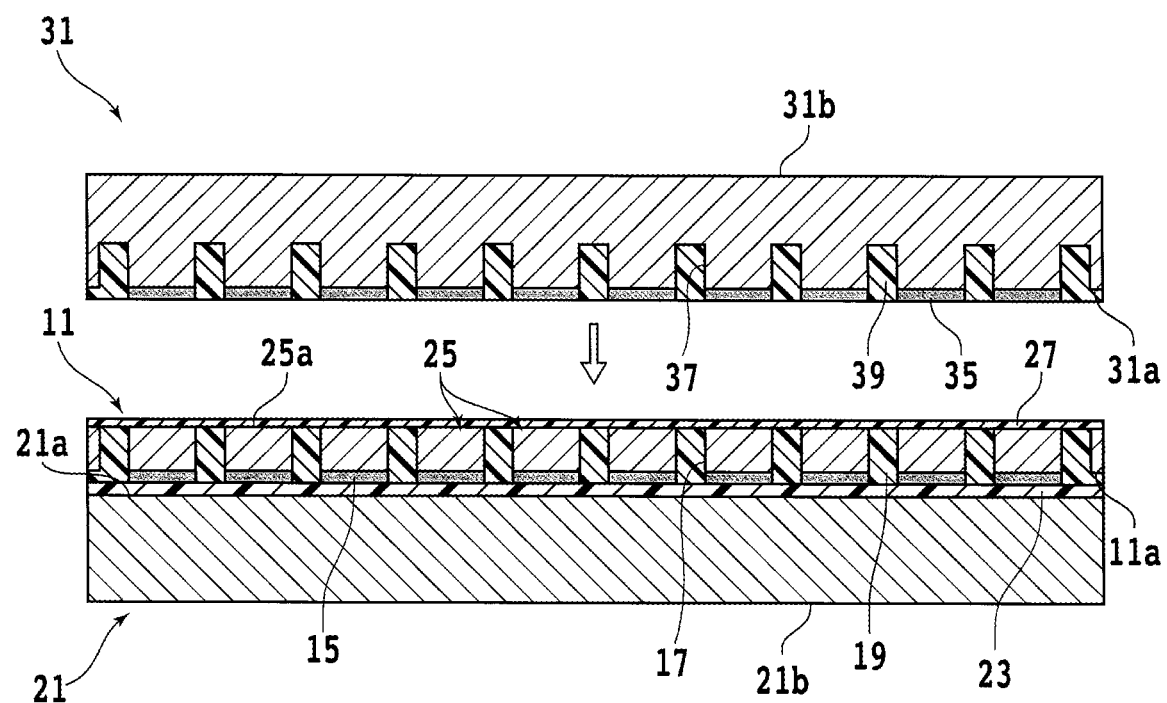
FIG. 8 is a sectional view schematically depicting a state in which a second wafer is being laminated to the first wafer.
Figure 9:
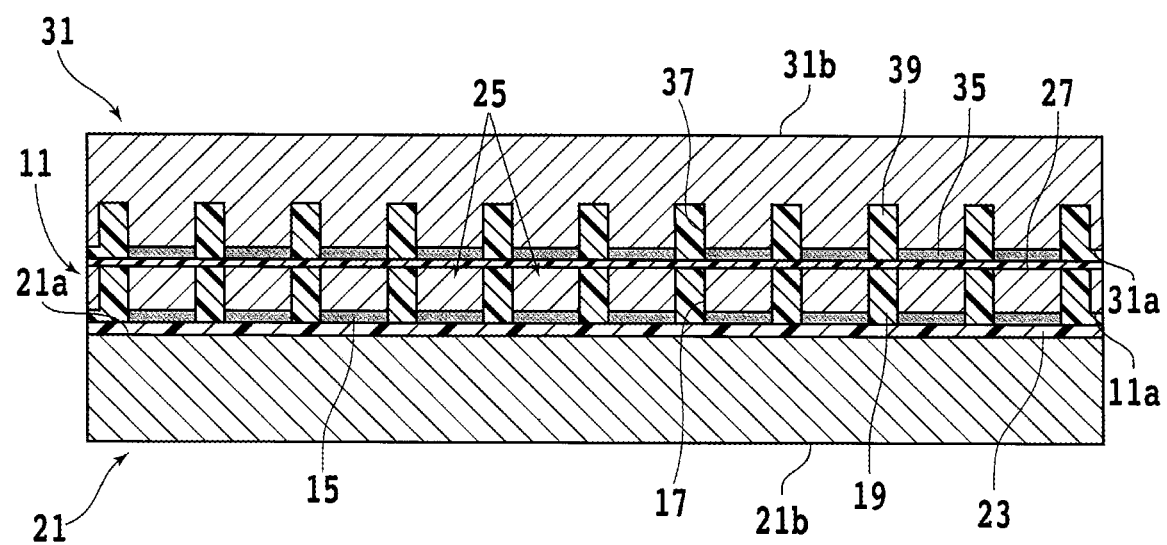
FIG. 9 is a sectional view schematically depicting the first support, the first wafer, and the second wafer laminated to the first wafer.

After the first wafer 11 is thinned, the top surface 31a side of the second wafer 31 in a state of being provided with the second resin layer 39 is laminated to the undersurface side of the first wafer 11 (undersurface 25a side of the first device chips 25) (laminating step). FIG. 8 is a sectional view schematically depicting a state in which the second wafer 31 is being laminated to the first wafer 11. FIG. 9 is a sectional view schematically depicting the first support 21, the first wafer 11, and the second wafer 31 laminated to the first wafer 11.

When the top surface 31a side of the second wafer 31 is laminated to the undersurface side of the first wafer 11, an adhesive layer 27 including an adhesive exhibiting an adhesive force is provided to the undersurface of the first wafer 11, as depicted in FIG. 8. Used as the adhesive layer 27 is a material in a liquid state, which includes an adhesive whose adhesive force is not decreased easily over a long period of time, the material being benzocyclobutene (BCB), for example.

However, the adhesive layer 27 used to laminate the first wafer 11 and the second wafer 31 to each other is not limited to this. As depicted in FIG. 9, the first wafer 11 and the second wafer 31 are laminated to each other by bringing the top surface 31a side of the second wafer 31 into close contact with the adhesive layer 27 provided to the undersurface of the first wafer 11 (undersurface 25a side of the first device chips 25).

Specifically, the undersurface side of the first wafer 11 and the top surface 31a side of the second wafer 31 are laminated to each other such that the first resin layer 19 exposed to the undersurface side of the first wafer 11 and the second resin layer 39 provided to the second grooves 37 of the second wafer 31 coincide with each other as viewed from a direction perpendicular to the undersurface of the first wafer 11.

That is, the undersurface side of the first wafer 11 and the top surface 31a side of the second wafer 31 are laminated to each other such that devices 35 of the second wafer 31 are superposed on the undersurfaces 25a of the first device chips 25. Thereafter, the adhesive layer 27 is preferably cured by a method such as heating, drying, or irradiation with light. Incidentally, this adhesive layer 27 may be provided to the second wafer 31 side rather than to the first wafer 11 side.

In addition, the first wafer 11 and the second wafer 31 may be laminated to each other without using the adhesive layer 27 including the adhesive as described above. For example, the first wafer 11 and the second wafer 31 can be laminated to each other by forming a thin oxide film on the undersurface side of the first wafer 11 and the top surface 31a side of the second wafer 31, and making the oxide films come into contact with each other and bond together. Incidentally, after the oxide films are bonded to each other, the bonding is preferably strengthened by a method such as heating.

Figure 10:
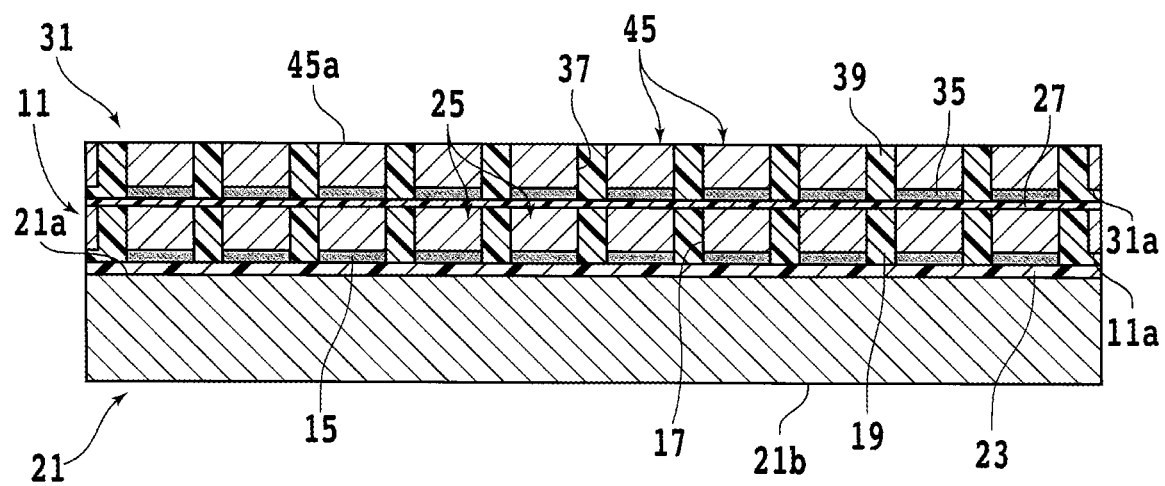
FIG. 10 is a sectional view schematically depicting the first support, the first wafer, and the second wafer in a thinned state.

After the top surface 31a side of the second wafer 31 is laminated to the undersurface side of the first wafer 11, the second resin layer 39 provided to the second grooves 37 is exposed to the undersurface side of the second wafer 31 by thinning the second wafer 31 to a thickness corresponding to the finished thickness of the second device chips from an undersurface 31b side (second wafer processing step). FIG. 10 is a sectional view schematically depicting the first support 21, the first wafer 11, and the thinned second wafer 31.

A method of thinning the second wafer 31 is similar to the method of thinning the first wafer 11. That is, the following method is used: grinding using a grinding wheel (grinding tool), polishing using a polishing pad (polishing tool), etching using a gas (including plasma) or a liquid having a high responsiveness to the second wafer 31, or the like.

In the present embodiment, as in the case of the first wafer 11, the second wafer 31 is thinned to a thickness corresponding to a finished thickness of second device chips 45 obtained by dividing the second wafer 31, by grinding the second wafer 31. As a result, as depicted in FIG. 10, bottom portions of the second grooves 37 are removed, and the second resin layer 39 provided to the second grooves 37 is exposed to the undersurface side of the second wafer 31 (undersurface 45a side of the second device chips 45). That is, the second wafer 31 is divided into a plurality of second device chips 45 along the second grooves 37 formed at the planned dividing lines.

Figure 11:
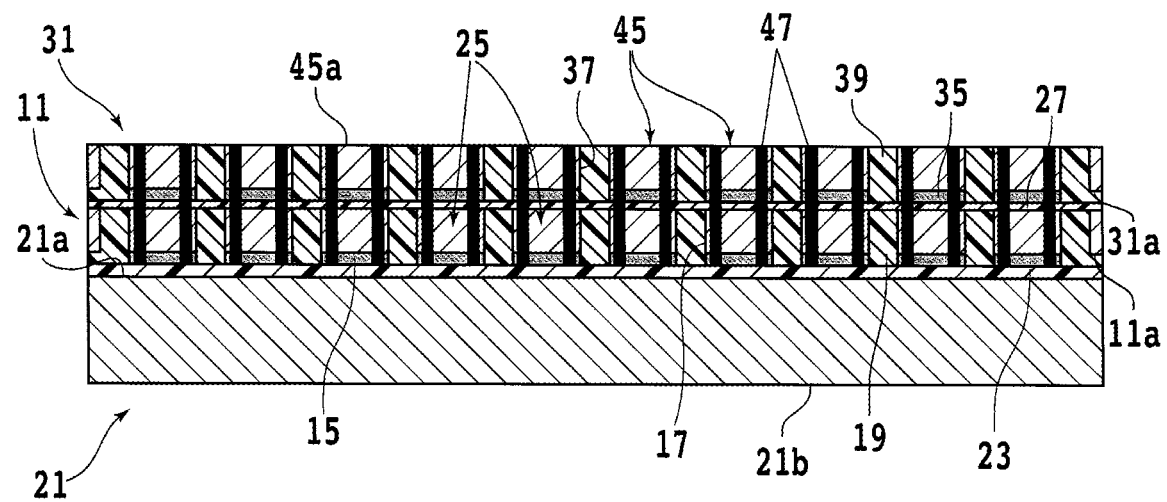
FIG. 11 is a sectional view schematically depicting the first support as well as the first wafer and the second wafer in which through electrodes are formed.

After the second wafer 31 is thinned, through electrodes are formed which connect the devices 15 of the first wafer 11 (first device chips 25) to the devices 35 of the second wafer 31 (second device chips 45) laminated to the first wafer 11 (through electrode forming step). FIG. 11 is a sectional view schematically depicting the first support 21 as well as the first wafer 11 and the second wafer 31 in which through electrodes 47 are formed.

When the through electrodes 47 that connect the devices 15 to the devices 35 are to be formed, through holes that penetrate at least the second device chips 45 and reach the devices 15 of the first device chips 25 are first formed in planned formation regions of the through electrodes 47 from the undersurface 45a side of the second device chips 45. There is no particular limitation on a method of forming the through holes. However, a method such as etching using a mask obtained by photolithography is preferably used.

After the through holes reaching the devices 15 are formed, the through electrodes 47 that connect the devices 15 to the devices 35 are formed in the through holes. There is no particular limitation on a method of forming the through electrodes 47. However, the through holes are preferably filled with an electrically conductive metal constituting the through electrodes 47 by using a method such as plating, sputtering, or chemical vapor deposition (CVD).

In the present embodiment, the side surfaces of the first device chips 25 obtained by dividing the first wafer 11 are covered with the first resin layer 19 by providing the first resin layer 19 to the first grooves 17 of the first wafer 11. Similarly, the side surfaces of the second device chips 45 obtained by dividing the second wafer 31 are covered with the second resin layer 39 by providing the second resin layer 39 to the second grooves 37 of the second wafer 31. Hence, when the through electrodes 47 are formed, metallic foreign matter does not adhere to the side surfaces of the first device chips 25, the side surface of the second device chips 45, or the like.

Figure 12:
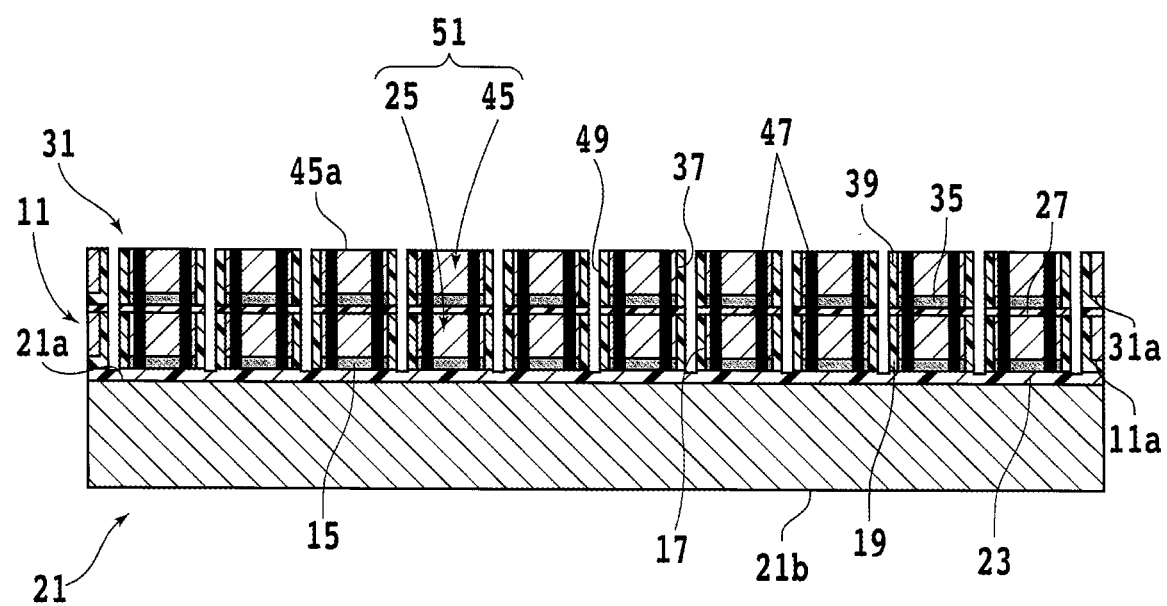
FIG. 12 is a sectional view schematically depicting the first support and a plurality of laminated device chips.

After the through electrodes 47 are formed, laminated device chips having a structure in which the first device chips 25 and the second device chips 45 are stacked are manufactured by cutting the first resin layer 19 along the first grooves 17, and cutting the second resin layer 39 along the second grooves 37 (resin layer cutting step). FIG. 12 is a sectional view schematically depicting the first support 21 and a plurality of laminated device chips 51.

When the first resin layer 19 and the second resin layer 39 are cut, an annular (disk-shaped) cutting blade (cutting tool), for example, is used, which is obtained by fixing abrasive grains of diamond or the like with a binder such as a resin. However, the width of this cutting blade is narrower than the width of the cutting blade used to form the first grooves 17 and the second grooves 37.

Specifically, while this cutting blade is rotated around a substantially horizontal rotational axis (axial rotation), and is made to cut into the first resin layer 19 and the second resin layer 39, the first wafer 11 and the second wafer 31 and the cutting blade are moved relative to each other along the first grooves 17 and the second grooves 37. Incidentally, a processing liquid such as pure water is supplied to a processing point at which the first resin layer 19 and the second resin layer 39 and the cutting blade are in contact with each other.

The present embodiment makes the cutting blade cut into the first resin layer 19 and the second resin layer 39 such that neither the side surfaces of the first device chips 25 nor the side surfaces of the second device chips 45 are processed and such that the first resin layer 19 and the second resin layer 39 can be cut completely. It is thereby possible to form kerfs 49 that section the first resin layer 19 and the second resin layer 39, and manufacture the laminated device chips 51 having a structure in which the first device chips 25 whose side surfaces are covered by the first resin layer 19 and the second device chips 45 whose side surfaces are covered by the second resin layer 39 are stacked.

However, there is no particular limitation on the method of cutting the first resin layer 19 and the second resin layer 39. For example, the first resin layer 19 and the second resin layer 39 can be cut by a method referred to as so-called ablation processing, which uses a laser beam of a wavelength absorbed by the first resin layer 19 and the second resin layer 39. After cutting the first resin layer 19 and the second resin layer 39, it is preferable to decrease the adhesive force of the adhesive layer 23, and separate the laminated device chips 51 from the first support 21.

As described above, the laminated device chip manufacturing method according to the present embodiment forms the first resin layer 19 in the first grooves 17 after forming the first grooves 17 of the depth corresponding to the finished thickness of the first device chips 25 in the first wafer 11, and forms the second resin layer 39 in the second grooves 37 after forming the second grooves 37 of the depth corresponding to the finished thickness of the second device chips 45 in the second wafer 31.

Therefore, the side surfaces of the first device chips 25 obtained from the first wafer 11 and the side surfaces of the second device chips 45 obtained from the second wafer 31 are covered by the first resin layer 19 and the second resin layer 39, respectively. That is, the side surfaces of the laminated device chips 51 having a structure in which the first device chips 25 and the second device chips 45 are stacked are also covered by the first resin layer 19 and the second resin layer 39. It is thereby possible to suppress the adhesion of foreign matter to the side surfaces of the laminated device chips 51.

In addition, when the first wafer 11 is thinned to the finished thickness of the first device chips 25, and the second wafer 31 is thinned to the finished thickness of the second device chips 45, the first wafer 11 is divided into the first device chips 25, and the second wafer 31 is divided into the second device chips 45. Therefore, the laminated device chips 51 can be completed by merely cutting the first resin layer 19 along the first grooves 17, and cutting the second resin layer 39 along the second grooves 37. That is, the first wafer 11 and the second wafer 31 are not damaged when cut into the laminated device chips 51.

It is to be noted that the present invention is not limited to the description of the foregoing embodiment, and can be variously modified and carried out. For example, in the foregoing embodiment, the second wafer 31 before being processed to be thin is laminated to the first wafer 11. However, the second wafer 31 may be processed to be thin, and then laminated to the first wafer 11. In this modification, the top surface 31a side of the second wafer 31 provided with the second resin layer 39 is fixed to a second support (not depicted) (second fixing step) by a procedure similar to that in the case of fixing the top surface 11a side of the first wafer 11 to the first support 21 (first fixing step).

After the first wafer 11 is fixed to the first support 21, the first resin layer 19 provided to the first grooves 17 is exposed to the undersurface side of the first wafer 11 by thinning the first wafer 11 from the undersurface 11b side to a thickness corresponding to the finished thickness of the first device chips 25 (first wafer processing step).

Then, after the second wafer 31 is fixed to the second support, the second resin layer 39 provided to the second grooves 37 is exposed to the undersurface side of the second wafer 31 by thinning the second wafer 31 from the undersurface 31b side to a thickness corresponding to the finished thickness of the second device chips 45 (second wafer processing step).

After the first wafer 11 and the second wafer 31 are thinned, for example, the second support is separated from the second wafer 31, and then the undersurface side of the first wafer 11 and the top surface 31a side of the second wafer 31 are laminated to each other (laminating step). More specifically, the undersurface side of the first wafer 11 and the top surface 31a side of the second wafer 31 are laminated to each other such that the first resin layer 19 exposed to the undersurface side of the first wafer 11 and the second resin layer 39 exposed to the top surface 31a side of the second wafer 31 coincide with each other as viewed from a direction perpendicular to the undersurface of the first wafer 11.

Incidentally, when the second support is separated from the second wafer 31, it is preferable to affix a dicing tape to the undersurface side of the second wafer 31, and support the second wafer 31 via the dicing tape. An adhesive layer used to laminate the first wafer 11 and the second wafer 31 to each other is similar to the adhesive layer 27 in the foregoing embodiment.

After the first wafer 11 and the second wafer 31 are laminated to each other, through electrodes are formed as required (through electrode forming step). Then, laminated device chips having a structure in which the first device chips 25 and the second device chips 45 are stacked are manufactured by cutting the first resin layer 19 along the first grooves 17, and cutting the second resin layer 39 along the second grooves 37 (resin layer cutting step).

Incidentally, in this modification, after the first wafer 11 and the second wafer 31 are thinned, the second support is separated from the second wafer 31, and then the undersurface side of the first wafer 11 and the top surface 31a side of the second wafer 31 are laminated to each other. However, the first wafer 11 and the second wafer 31 may be laminated to each other without the second support being separated from the second wafer 31.

In this case, the undersurface side of the first wafer 11 and the undersurface side of the second wafer 31 are laminated to each other such that the first resin layer 19 exposed to the undersurface side of the first wafer 11 and the second resin layer 39 exposed to the undersurface side of the second wafer 31 coincide with each other as viewed from a direction perpendicular to the undersurface of the first wafer 11 (laminating step).

Then, it suffices to thereafter separate the second support from the second wafer 31, and then cut the first resin layer 19 along the first grooves 17 and cut the second resin layer 39 along the second grooves 37 (resin layer cutting step). Also in this case, laminated device chips are similarly obtained which have a structure in which the first device chips 25 whose side surfaces are covered by the first resin layer 19 and the second device chips 45 whose side surfaces are covered by the second resin layer 39 are stacked.

In addition, in the foregoing embodiment and the foregoing modification, the first resin layer 19 and the second resin layer 39 are cut in a state in which the first wafer 11 (and the second wafer 31) is fixed to the first support 21. However, the first resin layer 19 and the second resin layer 39 may be cut after the first support 21 is separated from the first wafer 11.

In addition, in the foregoing embodiment and the foregoing modification, the through electrodes 47 that connect the devices 15 to the devices 35 are formed. However, the through electrodes 47 may not necessarily be formed. For example, in a case where electrodes or the like for connecting the devices 15 to the devices 35 are provided in advance, the processes related to the formation of the through electrodes 47 can be omitted.

In addition, in the foregoing embodiment and the foregoing modification, a laminated device chip having a structure in which two device chips are stacked is formed by laminating two wafers. However, a laminated device chip having a structure in which three or more device chips are stacked can be formed by laminating three or more wafers by a similar method.

Besides, structures, methods, and the like according to the foregoing embodiment and the foregoing modification can be modified and implemented as appropriate without departing from the objective scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laminated device chip manufacturing method for manufacturing laminated device chips having a structure in which a plurality of device chips are stacked, by using wafers having a device disposed in each of a plurality of regions of a top surface demarcated by a plurality of planned dividing lines, the laminated device chip manufacturing method comprising:
   a first groove forming step of forming first grooves of a depth corresponding to a finished thickness of first device chips obtained by dividing a first wafer from a top surface of the first wafer along a plurality of planned dividing lines of the first wafer;
   a first resin layer forming step of forming a first resin layer in the first grooves of the first wafer;
   a second groove forming step of forming second grooves of a depth corresponding to a finished thickness of second device chips obtained by dividing a second wafer from a top surface of the second wafer along a plurality of planned dividing lines of the second wafer;
   a second resin layer forming step of forming a second resin layer in the second grooves of the second wafer;
   a fixing step of fixing a top surface side of the first wafer to a plate-shaped first support;
   a first wafer processing step of exposing the first resin layer disposed in the first grooves to an undersurface side of the first wafer by thinning the first wafer fixed to the first support to a thickness corresponding to the finished thickness of the first device chips from the undersurface side;
   a laminating step of laminating the undersurface side of the first wafer and a top surface side of the second wafer to each other such that the first resin layer exposed to the undersurface side of the first wafer and the second resin layer disposed in the second grooves of the second wafer coincide with each other as viewed from a direction perpendicular to an undersurface of the first wafer;
   a second wafer processing step of exposing the second resin layer disposed in the second grooves to an undersurface side of the second wafer by thinning the second wafer laminated to the first wafer to a thickness corresponding to the finished thickness of the second device chips from the undersurface side;
   a resin layer cutting step of manufacturing the laminated device chips having a structure in which the first device chips having side surfaces covered by the first resin layer and the second device chips having side surfaces covered by the second resin layer are stacked, by cutting the first resin layer along the first grooves, and cutting the second resin layer along the second grooves; and
   a through electrode forming step of forming through electrodes that connect devices of the first wafer to devices of the second wafer laminated to the first wafer;
   wherein the through electrodes are formed in at least the second device chips.

2. The laminated device chip manufacturing method according to claim 1, wherein
   the resin layer cutting step separates the first support from the first wafer, and then cuts the first resin layer along the first grooves and cuts the second resin layer along the second grooves.

3. A laminated device chip manufacturing method for manufacturing laminated device chips having a structure in which a plurality of device chips are stacked, by using wafers having a device disposed in each of a plurality of regions of a top surface demarcated by a plurality of planned dividing lines, the laminated device chip manufacturing method comprising:
   a first groove forming step of forming first grooves of a depth corresponding to a finished thickness of first device chips obtained by dividing a first wafer from a top surface of the first wafer along a plurality of planned dividing lines of the first wafer;
   a first resin layer forming step of forming a first resin layer in the first grooves of the first wafer;
   a first fixing step of fixing a top surface side of the first wafer to a plate-shaped first support;
   a first wafer processing step of exposing the first resin layer disposed in the first grooves to an undersurface side of the first wafer by thinning the first wafer fixed to the first support to a thickness corresponding to the finished thickness of the first device chips from the undersurface side;
   a second groove forming step of forming second grooves of a depth corresponding to a finished thickness of second device chips obtained by dividing a second wafer from a top surface of the second wafer along a plurality of planned dividing lines of the second wafer;
   a second resin layer forming step of forming a second resin layer in the second grooves of the second wafer;
   a second fixing step of fixing a top surface side of the second wafer to a plate-shaped second support;
   a second wafer processing step of exposing the second resin layer disposed in the second grooves to an undersurface side of the second wafer by thinning the second wafer fixed to the second support to a thickness corresponding to the finished thickness of the second device chips from the undersurface side;
   a laminating step of separating the second support from the second wafer, and then laminating the undersurface side of the first wafer and the top surface side of the second wafer to each other such that the first resin layer exposed to the undersurface side of the first wafer and the second resin layer exposed to the top surface side of the second wafer coincide with each other as viewed from a direction perpendicular to an undersurface of the first wafer;
   a resin layer cutting step of manufacturing the laminated device chips having a structure in which the first device chips having side surfaces covered by the first resin layer and the second device chips having side surfaces covered by the second resin layer are stacked, by cutting the first resin layer along the first grooves, and cutting the second resin layer along the second grooves; and
   a through electrode forming step of forming through electrodes that connect devices of the first wafer to devices of the second wafer laminated to the first wafer;
   wherein the through electrodes are formed in at least the second device chips.

4. The laminated device chip manufacturing method according to claim 3, wherein the resin layer cutting step separates the first support from the first wafer, and then cuts the first resin layer along the first grooves and cuts the second resin layer along the second grooves.

5. A laminated device chip manufacturing method for manufacturing laminated device chips having a structure in which a plurality of device chips are stacked, by using wafers having a device disposed in each of a plurality of regions of a top surface demarcated by a plurality of planned dividing lines, the laminated device chip manufacturing method comprising:
- a first groove forming step of forming first grooves of a depth corresponding to a finished thickness of first device chips obtained by dividing a first wafer from a top surface of the first wafer along a plurality of planned dividing lines of the first wafer;
- a first resin layer forming step of forming a first resin layer in the first grooves of the first wafer;
- a first fixing step of fixing a top surface side of the first wafer to a plate-shaped first support;
- a first wafer processing step of exposing the first resin layer disposed in the first grooves to an undersurface side of the first wafer by thinning the first wafer fixed to the first support to a thickness corresponding to the finished thickness of the first device chips from the undersurface side;
- a second groove forming step of forming second grooves of a depth corresponding to a finished thickness of second device chips obtained by dividing a second wafer from a top surface of the second wafer along a plurality of planned dividing lines of the second wafer;
- a second resin layer forming step of forming a second resin layer in the second grooves of the second wafer;
- a second fixing step of fixing a top surface side of the second wafer to a plate-shaped second support;
- a second wafer processing step of exposing the second resin layer disposed in the second grooves to an undersurface side of the second wafer by thinning the second wafer fixed to the second support to a thickness corresponding to the finished thickness of the second device chips from the undersurface side;
- a laminating step of laminating the undersurface side of the first wafer and the undersurface side of the second wafer to each other such that the first resin layer exposed to the undersurface side of the first wafer and the second resin layer exposed to the undersurface side of the second wafer coincide with each other as viewed from a direction perpendicular to an undersurface of the first wafer;
- a resin layer cutting step of separating the second support from the second wafer, and then manufacturing the laminated device chips having a structure in which the first device chips having side surfaces covered by the first resin layer and the second device chips having side surfaces covered by the second resin layer are stacked, by cutting the first resin layer along the first grooves, and cutting the second resin layer along the second grooves;
- a through electrode forming step of forming through electrodes that connect devices of the first wafer to devices of the second wafer laminated to the first wafer;
- wherein the through electrodes are formed in at least the second device chips.

6. The laminated device chip manufacturing method according to claim 5, wherein
the resin layer cutting step separates the first support from the first wafer, and then cuts the first resin layer along the first grooves and cuts the second resin layer along the second grooves.

* * * * *